United States Patent [19]

Summerfelt et al.

[11] Patent Number: 5,619,393
[45] Date of Patent: Apr. 8, 1997

[54] HIGH-DIELECTRIC-CONSTANT MATERIAL ELECTRODES COMPRISING THIN RUTHENIUM DIOXIDE LAYERS

[75] Inventors: Scott R. Summerfelt, Dallas; Howard R. Beratan, Richardson; Bruce E. Gnade, Dallas, all of Tex.

[73] Assignee: Texas Instruments Incorporated, Dallas, Tex.

[21] Appl. No.: 472,149

[22] Filed: Jun. 7, 1995

Related U.S. Application Data

[63] Continuation of Ser. No. 283,881, Aug. 1, 1994.
[51] Int. Cl.$^6$ ................................................. H01G 4/005
[52] U.S. Cl. ................... 361/321.1; 361/305; 361/311; 361/312; 361/313; 361/320; 29/25.42; 438/396; 438/608; 438/240
[58] Field of Search ................... 361/305, 306, 361/311, 312, 313, 320, 321.1–321.4; 437/47, 52, 60; 29/25.42

[56] References Cited

U.S. PATENT DOCUMENTS

| | | | |
|---|---|---|---|
| 4,809,225 | 2/1989 | Dimmler et al. | 365/145 |
| 4,853,983 | 8/1989 | Grant | 4/251 |
| 4,873,644 | 10/1989 | Fujii et al. | 364/478 |
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 4,914,627 | 4/1990 | Eaton, Jr. et al. | 365/145 |
| 4,918,654 | 4/1990 | Eaton, Jr. et al. | 365/145 |
| 4,982,309 | 1/1991 | Shepherd | 361/321 |
| 5,053,917 | 10/1991 | Miyasaka et al. | 361/321 |
| 5,079,200 | 1/1992 | Jackson | 501/136 |
| 5,122,923 | 6/1992 | Matsubara et al. | 361/321 |
| 5,191,510 | 3/1993 | Huffman | 361/313 |

FOREIGN PATENT DOCUMENTS

| | | | |
|---|---|---|---|
| 0557937A1 | 2/1993 | European Pat. Off. | H01L 21/3205 |

OTHER PUBLICATIONS

A. F. Tasch, Jr. and L. H. Parker, "Memory Cell and Technology Issues for 64 and 256–Mbit One–Transistor Cell MOS DRAMs," *Proceedings of the IEEE*, vol. 77, No. 3, Mar. 1989, pp. 374–388.

K. Takemura, et al., "Barrier Mechanism of Pt/Ta and Pt/Ti Layers for SrTiO$_3$ Thin Film Capacitors on Si," *4th Inter. Symp. on Integrated Ferroelectrics*, C52 (1992) pp. 481–488.

T. Sakuma, S. Yamamichi, S. Matsubara, H. Yamaguchi, and Y. Miyasaka, "Barrier Layers for Realization of High Capacitance Density in SrTiO$_3$ Thin–Film Capacitor on Silicon," *Appl. Phys. Lett.*, 57 (23) 3 Dec. 1990, pp. 2431–2433.

(List continued on next page.)

*Primary Examiner*—Michael W. Phillips
*Assistant Examiner*—Anthony Dinkins
*Attorney, Agent, or Firm*—Brian A. Carlson; James C. Kesterson; Richard L. Donaldson

[57] ABSTRACT

A preferred embodiment of this invention comprises a thin unreactive film (e.g. ruthenium dioxide 36) contacting a high-dielectric-constant material (e.g. barium strontium titanate 38) to an electrode. The thin unreactive film provides a stable conductive interface between the high-dielectric-constant material layer and the electrode base (e.g palladium 34). As opposed to a standard thin-film layer, the thin unreactive film is generally less than 50 nm thick, preferably less than 35 nm thick, more preferably between 5 nm and 25 nm thick, and most preferably between 10 nm and 20 nm thick. A thin unreactive film can benefit from the advantages of the materials used while avoiding or minimizing many of their disadvantages. A thin unreactive film would generally be substantially less expensive than a standard thin-film layer since much less material can be used while not significantly affecting the surface area of the electrode in contact with the HDC material. These structures may also be used for multilayer capacitors and other thin-film ferroelectric devices such as pyroelectric materials, non-volatile memories, thin-film piezoelectric and thin-film electro-optic oxides.

22 Claims, 11 Drawing Sheets

OTHER PUBLICATIONS

M.-A. Nicolet, "Diffusion Barriers in Thin Films," *Thin Solid Films*, 52 (1978) 415–443.

M.-A. Nicolet, "Thin Film Diffusion Barrier for Metal-Semiconductor Contacts," *Materials Research Society*, 1987, pp. 19–26.

C. J. Brennan, "Characterization and Modelling of Thin-Film Ferroelectric Capacitors Using C–V Analysis," *Proc. 3rd Inter. Symp. on Integrated Ferroelectrics*, 354–363 (1991).

J. F. Scott, B. M. Melnick, C. A. Araujo, L. D. McMillan and R. Zuleeg, "D.C. Leakage Currents in Ferroelectric Memories," *Proc. 3rd Inter. Symp. on Integrated Ferroelectrics*, 176–184 (1991).

R. Waser and M. Klee, "Theory of Conduction and Breakdown in Perovskite Thin Films," *Proc. 3rd Inter. Symp. on Integrated Ferroelectrics*, 288–305 (1991).

P. D. Hren, H. N. Al–Shareef, S. H. Rou, A. I. Kingon, P. Buaud, and E. A. Irene, "Hillock Formation in Pt Films," *Proc. MRS*, 1992.

H. N. Al–Shareef, K. D. Gifford, P. D. Hren, S. H. Rou, O. Auciello, and A. I. Kingon, "Bottom Electrodes for Ferroelectric Thin Films," 1992.

S. Saito and K. Kuramasu, "Plasma Etching of $RuO_2$ Thin Films," *Japn. J. Appl. Phys.*, vol. 31, 1992, pp. 135–138.

S. K. Dey and R. Zuleeg, "Processing and Parameters of Sol–Gel PZT Thin–Films for GaAs Memory Applications," *Ferroelectrics*, vol. 112, 1990, pp. 309–319.

C. Hanson, H. Beratan, R. Owen, M. Corbin, and S. McKenney, "Uncooled Thermal Imaging at Texas Instruments," *SPIE*, 1735, 17 (1992).

B. Kulwicki, A. Amin, H. R. Beratan, and C. M. Hanson, "Pyroelectric Imaging," *ISAF*, 92, (1992).

D. L. Polla, C.-P. Ye and T. Yamagawa, "Surface–Micromachined $PbTiO_3$ Pyroelectric Detectors," *Appl. Phys. Lett.* 59, 1991, pp. 3539–3541.

K. R. Bellur, H. N. Al–Shareef, S. H. Rou, K. D. Gifford, O. Auciello, and A. I. Kingon, "Electrical Characterization of Sol–Gel Derived PZT Thin Films," 1992.

S. D. Bernstein, T. Y. Wong, Y. Kisler, and R. W. Tustison, "Fatigue of Ferroelectric $PbZr_xTi_yO_3$ Capacitors with Ru and $RuO_x$ Electrodes," *J. Mat. Res.*, 8, 1993, pp. 12–13.

P. D. Hren, S. H. Rou, H. N. Al–Shareef, M.S. Ameen, O. Auciello, and A. I. Kingon, "Bottom Electrodes for Integrated Pb(Zr,Ti)$O_3$ Films," *Integrated Ferroelectrics*, vol. 2, No. 1–4, 1992.

K. Char, M. S. Colclough, T. H. Geballe, and K. E. Myers, "High T Superconductor–Normal–Superconductor Josephson Junctions Using $CaRuO_3$ as the Metallic Barrier," *Appl. PHys. Lett.*, 62, 1993, pp. 196–198.

Yasushiro Nishioka et al., "Time Dependent, Dielectric Breakdown Characteristics of $Ta_2O_5/SiO_2$ Double Layers," *Journal of the Electrochemical Society*, vol. 136, No. 3, Mar. 1989, pp. 872–873.

H. Jehn et al., "Surface and Interface Characterization of Heat–Treated (Ti,Al)N Coatings on High Speed Steel Substrates," *Thin Solid Films*, 153 (1987) 45–53.

Shigeaki Zaima et al., "Conduction Mechanism of Leakage Current in $Ta_2O_5$ Films on Si Prepared by LPCVD," *Journal of the Electrochemical Society*, vol. 137, No. 9, Sep. 1990, pp. 2876–2879.

Yasushiro Nishioka et al., "Infuence of $SiO_2$ at the $Ta_2O_5/Si$ Interface on Dielectric Characteristics of $Ta_2O_5$ Capacitors," *Journal of Applied Physics*, 61 (6), Mar. 15, 1987, pp. 2335–2338.

Shigeaki Zaima et al., "Preparation and Properties of $Ta_2O_5$ Films by LPCVD for ULSI Application," *Journal of the Electrochemical Society*, vol. 137, No. 4, Apr. 1990, pp. 1297–13000.

G. Arlt et al., "Dielectric Properties of Fine–Grained Barium Titanate Ceramics," *Journal of Applied Physics*, 58 (4), Aug. 15, 1985, pp. 1619–1625.

Yoichi Miyasaka et al., "Dielectric Properties of Sputter-Deposited $BaTiO_3$–$SrTiO_3$ Thin Films," *19990 IEEE 7th International Symposium on Applications of Ferroelectrics*, IEEE (1991), pp. 121–124.

Q. X. Jia et al., "Reactively Sputtered $RuO_2$ Thin Film Resistor With Near Zero Temperature Coefficient of Resistance," *Thin Solid Films*, 196 (1991) pp. 29–34.

T. Eimore, et al., "A Newly Designed Planar Stacked Capacitor Cell with High Dielectric Constant Film for 256 Mbit DRAM," *IEEE*, Dec. 5–8, 1993.

J. M. Molarius et al., "Tantalum–Based Encapsulants for Thermal Annealing of GaAs," *Journal of the Electrochemical Society*, vol. 138, No. 3, Mar. 1991, pp. 834–837.

H. Ichimura et al., "High–Temperature Oxidation of Ion-Plated TiN and TiAlN Films," *J. Mater. Res.*, vol. 8, No. 5, May 1993, pp. 1093–1100.

E. Kolawa et al., "Amorphous Ta–Si–N Thin Films Alloys as Diffusion Barrier in Al/Si," *J. Vac. Sci. Technol.*, A 8 (3), May/Jun 1990, pp. 3006–3010.

M-A. Nicolet et al., "Issues in Metal/Semiconductor Contact Design and Implementation," *Solar Cells*, 27 (1989) 177–189.

P. J. Pokela et al., "Characterization of the AL/Ta–Si–N/Au Metallization," *Thin Solid Films*, 203 (1991) 259–266.

L. E. Halperin, "Silicon Schottky Barriers and p–n Junctions with Highly Stable Aluminum Contact Metallization," *IEEE Electron Device Letters*, vol. 12, No. 6, Jun. 1991, pp. 309–311.

E. Kolawa, "Sputtered Ta–Si–N Diffusion Barriers in Cu Metallizations for Si," *IEEE Electron Device Letters*, vol. 12, No. 6, Jun. 1991, pp. 321–323.

P. J. Pokela et al., "Amorphous Ternary Ta–Si–N Diffusion Barrier Between Si and Au," *J. Electrochem. Soc.*, vol. 138, No. 7, Jul. 1991, pp. 2125–2129.

E. Kolawa et al., "Amorphous Ta–Si–N Diffusion Barriers in Si/Al and Si/Cu Metallizations" *Applied Surface Science*, 53 (1991) 373–376.

P. J. Pokela et al., "Thermal Oxidation of Amorphous Ternary $Ta_{36}Si_{14}N_{50}$ Thin Film," *J. Appl. Phys.*, 70 (5), 1 Sep. 1991, pp. 2828–2832.

J. S. Reid et al., "Evaluation of Amorphous (Mo, Ta, W)–Si–N Diffusion Barriers for <Si>/Cu Metallizations," *Thin Solid Films*, 236 (1993) 319–324.

J. S. Chen et al., "Stable Pt/Ge/Au Ohmic Contact to n–GaAs with a Ta–Si–N Barrier," *Mat. Res. Soc. Symp. Proc.*, vol. 300, 1993, pp. 255–260.

J. S. Reid et al., "Ti–Si–N Diffusion Barriers Between Silicon and Copper," *IEEE Electron Device Letters*, vol. 15, No. 8, 1994, pp. 298–300.

G. F. McLane, et al., "Reactive Ion Etching of Ta–Si–N Diffusion Barrier Material in $CF_4+O_2$", *Journal of Vacuum Science and Technology B*, vol. 12, No. 4, Jul./Aug. 1994, pp. 2352–2355, from the 1994 MRS spring mtg.

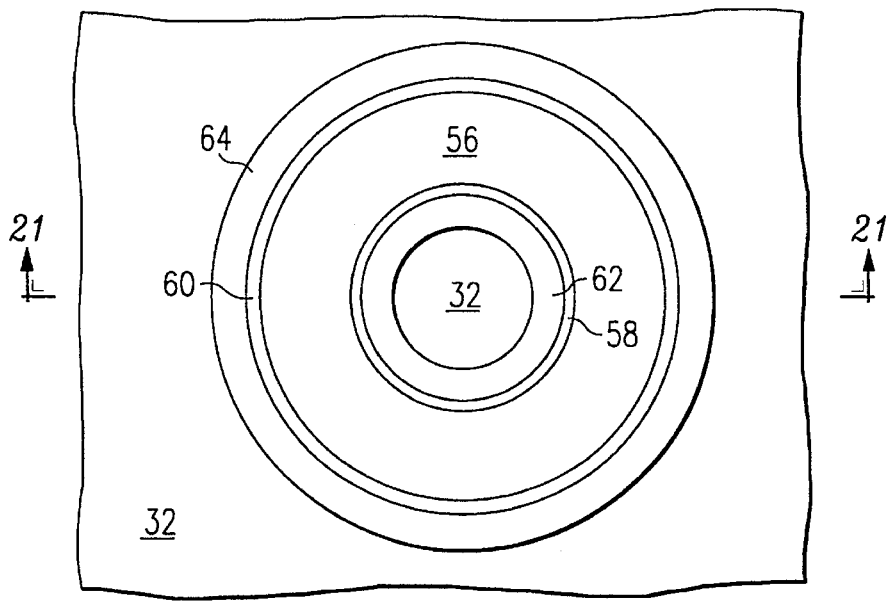
FIG. 22
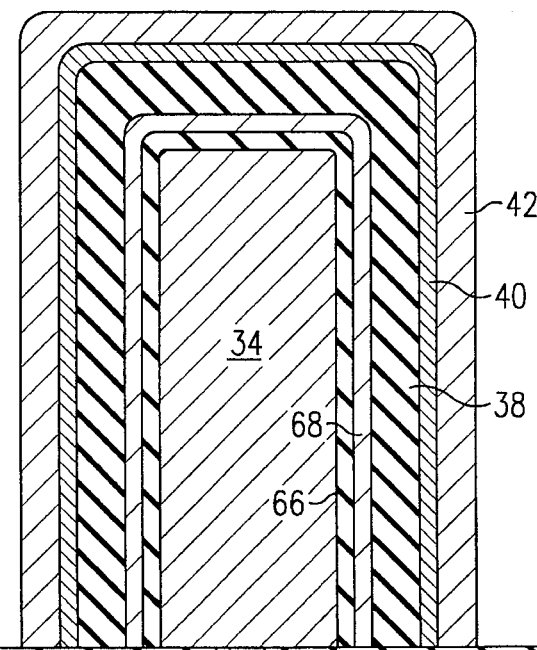
FIG. 23
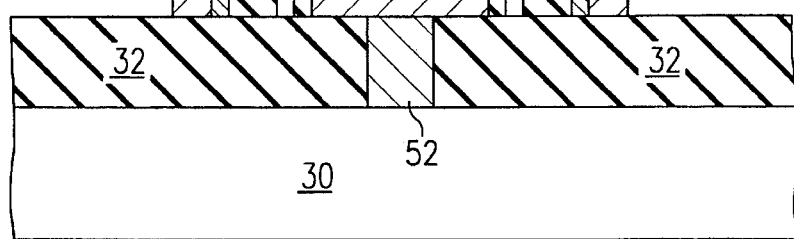

HIGH-DIELECTRIC-CONSTANT MATERIAL ELECTRODES COMPRISING THIN RUTHENIUM DIOXIDE LAYERS

This is a continuation of application Ser. No. 08/283,881 filed Aug. 1, 1994.

CROSS-REFERENCES TO RELATED APPLICATIONS

The following related applications were filed concurrently with the instant application:

| Title | Inventors | Docket/Serial Number |
|---|---|---|
| Improved Electrodes Comprising Conductive Perovskite-Seed Layers for Perovskite Dielectrics | Summerfelt, Beratan | TI-17952 |
| Improved High-Dielectric-Constant Material Electrodes Comprising Thin Ruthenium Dioxide Layers | Summerfelt, Beratan, Kirlin, Gnade | TI-19153 |
| Pre-oxidizing High-Dielectric-Constant Material Electrodes | Nishioka, Summerfelt, Park, Bhattacharya | TI-19189 |
| High-Dielectric-Constant Material Electrodes Comprising Sidewall Spacers | Nishioka, Park, Bhattacharya, Summerfelt | TI-19272 |
| A Conductive Amorphous-Nitride Barrier Layer for High-Dielectric-Constant Material Electrodes | Summerfelt | TI-19554 |
| A Conductive Exotic-Nitride Barrier Layer for High-Dielectric-Constant Material Electrodes | Summerfelt | TI-19555 |
| A Conductive Noble-Metal-Insulator-Alloy Barrier Layer for High-Dielectric-Constant Material Electrodes | Summerfelt, Nicolet, Reid, Kolawa | TI-19556 |

The following previously filed applications are related to the instant application:

| Title | Inventors | Docket/Serial Number |
|---|---|---|
| Improved Electrical Connections to Dielectric Materials | Gnade, Summerfelt | 08/009,521 |
| Improved Electrical Connections to Dielectric Materials | Gnade, Summerfelt | 08/260,149 |
| Lightly Donor Doped Electrodes for High-Dielectric-Constant Materials | Summerfelt, Beratan, Gnade | 08/040,946 |
| Lightly Donor Doped Electrodes for High-Dielectric-Constant Materials | Summerfelt, Beratan, Gnade | TI-17660.1 |
| Improved Electrode Interface for High-Dielectric-Constant Materials | Summerfelt, Beratan | 08/041,025 |

FIELD OF THE INVENTION

This invention generally relates to improving electric connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, ferroelectric, or high-dielectric-constant (hereafter abbreviated HDC) materials such as $(Ba,Sr)TiO_3$ (BST) usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high-dielectric-constant materials.

SUMMARY OF THE INVENTION

As used herein, the term "high-dielectric-constant" means a dielectric constant greater than about 50 at device operating temperature. The deposition of an HDC material usually occurs at high temperature (generally greater than about 500° C.) in an oxygen containing atmosphere. An initial electrode structure formed prior to this deposition should be stable both during and after this deposition, while subsequent electrode structures formed after this deposition need only be stable after this deposition.

It is herein recognized there are several problems with the materials thus far chosen for the electrodes in standard thin-film (herein defined as generally less than 5 microns (um) and greater than 50 nanometers (nm)) applications; some of these problems are related to semiconductor process integration. For example, it has been found that it is difficult to use Pt alone as an initial electrode. Pt generally allows oxygen to diffuse through it and hence typically allows neighboring materials to oxidize. Pt also does not normally stick very well to traditional dielectrics such as $SiO_2$ or $Si_3N_4$, and Pt can rapidly form a silicide at low temperatures. A Ta layer has been used as a sticking or buffer layer under the Pt electrode, however during BST deposition, oxygen can diffuse through the Pt and oxidize the Ta and make the Ta less conductive. This may possibly be acceptable for structures in which contact is made directly to the Pt layer instead of to the Ta layer, but there are other associated problem as described hereinbelow.

Conductive oxides such as $RuO_2$ generally also exhibit problems in standard thin-film structures. For example, the electrical properties of the structures formed using these oxides are usually inferior to those formed using e.g. Pt. Many thin-film applications require a small leakage-current-density in addition to a large capacitance per unit area. The leakage current is sensitive to many variables such as thickness, microstructure, electrodes, electrode geometry and composition, For example, the leakage current of lead zirconium titanate (PZT) using $RuO_2$ electrodes is several orders of magnitude larger than the leakage current of PZT using Pt electrodes. In particular, it appears that the leakage current is controlled by Schottky barriers, and that the smaller leakage current with Pt electrodes appears to be due to the larger work function.

Other structures which have been proposed for standard thin-film structures include alloys of Pt, Pd, Rh as the electrode and oxides made of Re, Os, Rh and Ir as a sticking layer on single crystal Si or poly-Si. A problem with these electrodes is that these oxides are usually not stable next to Si and that these metals typically rapidly form silicides at low temperatures (generally less than about 450° C.). If other associated problems can be avoided or minimized, this type of electrode structure should retain its conductivity even after the deposition of the HDC material if an appropriate barrier layer(s) is used between the conductive oxide and the Si substrate.

Thus, it can be seen that each different method or material or structure for high-dielectric-constant material electrodes has its own unique characteristics, yielding distinctive advantages and disadvantages. For example, each material has a different temperature/time threshold above which that material typically should not be exposed. As another example, in standard thin-film structures, Pt can form hillocks which can degrade the leakage current properties or even short out a capacitor. As another example, Ru is generally not a standard integrated circuit manufacturing material, and it can also be relatively toxic. However, Ru/$RuO_2$ can function as an oxygen diffusion barrier or even as an oxygen source to minimize HDC material reduction.

As a further example, TiN has been proven and accepted for use in integrated circuits, while Pt and Pd have seen a relatively more limited use (typically in bipolar circuits and not in metal oxide semiconductor (MOS)). TiN is generally a good sticking layer and diffusion barrier, but typically cannot withstand as high a temperature as Pt or Pd. As yet another example, Pt has a radioactive isotope, Pt-190, that, even though it has a relatively long half-life and makes up a small percentage of the total number of Pt atoms, could create a substantial number of detrimental alpha-particles when used in a standard thin-film structure.

Although each material is unique, some of the various materials described hereinabove do have some relevant characteristics in common. For example, Pt and $RuO_2$ have been relatively difficult to dry etch in standard thin-film structures. Additionally, the relatively high cost of Pt and Ru may be prohibitive in some standard thin-film structures.

Generally, the instant invention uses a thin unreactive film to contact the electrode to the high-dielectric-constant material. The thin unreactive film my be a noble metal such as Pt or a conductive oxide such as $RuO_2$. As opposed to a standard thin-film layer, the thin unreactive film is generally less than 50 nm thick, preferably less than 35 nm thick, more preferably between 5 nm and 25 nm thick, and most preferably between 10 nm and 20 nm thick. As used herein, the term "unreactive", when used in reference to a material contacting an HDC material, means a material which provides a stable conductive interface to the HDC material during and after processing. Note that when a conductive oxide such as $RuO_2$ is used for the thin unreactive film (or another part of the electrode), that layer can also contain unoxidized or partially oxidized Ru. For example, a thin unreactive film of Ru which is chemically changed by becoming partially or fully oxidized during the HDC deposition process is still considered unreactive since it still provides a stable conductive interface to the HDC material. The same applies to iridium oxide and iridium.

A thin unreactive film can benefit from the advantages of the various materials discussed hereinabove while avoiding or minimizing many of the disadvantages. For example, a thin unreactive film would generally be substantially less expensive than a standard thin-film layer since much less material can be used while not significantly affecting the surface area of the electrode in contact with the HDC material. Cost and economic feasibility are usually important considerations in semiconductor manufacturing, and can often be the determining factors in whether or not one method or structure is viable when compared to another (e.g. less process steps with a more expensive material versus more process steps with a less expensive material). The method or structure selected will generally depend on the specific application.

The issue of economic feasibility should become more significant as new devices with higher component densities are sought. Specifically, it will probably be desirable for the electrode to have a higher aspect ratio than prior art devices in order to achieve a large surface area in contact with the HDC material while minimizing the amount of semiconductor real estate used. As used herein, the term "aspect ratio", when used in reference to the physical dimensions of a structure, means the ratio of the height to the width of a structure. This will also have the effect of increasing the volume of the electrode and thus the amount of material used for the electrode. By using a less expensive material for a substantial portion of the volume of the electrode and only a thin unreactive film formed on the surface of the less expensive material, significant material cost savings should result.

One embodiment of the present invention is a microelectronic structure comprising a conductive lower electrode base, a lower thin unreactive film overlaying the lower electrode base, and a high-dielectric-constant material layer overlaying the lower unreactive film. The lower unreactive film provides a stable conductive interface between the high-dielectric-constant material layer and the lower electrode base.

A method of forming an embodiment of the present invention comprises forming a conductive lower electrode base, forming a lower thin unreactive film on the lower electrode base, and forming a high-dielectric-constant material layer on the lower unreactive film. An upper thin unreactive film may be formed on high-dielectric-constant material layer, and an upper electrode may then be formed on the upper unreactive film. Alternatively, a second thin unreactive film may be formed on the lower thin unreactive film before the formation of the high-dielectric-constant material.

Another method of forming an embodiment of the present invention comprises forming a high-dielectric-constant material pillar, the pillar comprising an outer vertical surface and an open-ended cavity with an inner vertical surface, forming an inner thin unreactive film on the inner vertical surface and an outer thin unreactive film on the outer vertical surface, and forming an inner conductive electrode on the inner thin unreactive film and an outer conductive electrode on the outer thin unreactive film. In accordance with this embodiment, generally less demand is placed on the electrodes since they are formed after the high-dielectric-constant material deposition.

When platinum is used as the lower thin unreactive layer, then a non-platinum conductive lower electrode base is used. When ruthenium dioxide is used as the lower thin unreactive layer, then a non-Ru, non-$RuO_2$ conductive lower electrode base is used.

These are apparently the first microelectronic structures wherein a thin unreactive film backed up by a less expensive, more easily etched bulk electrode is used to contact an electrode to a high-dielectric-constant material. These structures may also be used for multilayer capacitors and other thin-film devices such as pyroelectric materials, non-volatile memories, thin-film piezoelectric and thin-film electro-optic devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 22 is a top plan view of a capacitor with inner and outer thin unreactive films contacting a high-dielectric-constant material;

FIG. 23 is a cross-sectional view of a capacitor with two lower thin unreactive films providing a conductive interface between a high-dielectric-constant material and a lower electrode base.

DETAILED DESCRIPTION OF THE PREFERRED EMBODIMENTS

Figure 1:
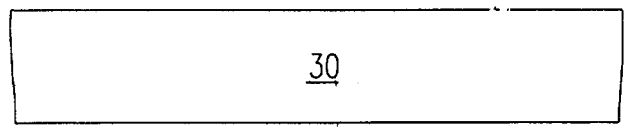
FIGS. 1–7 are cross-sectional views of a microelectronic structure showing the progressive steps in the fabrication of a capacitor with lower and upper thin unreactive films contacting a high-dielectric constant material.
Figure 2:
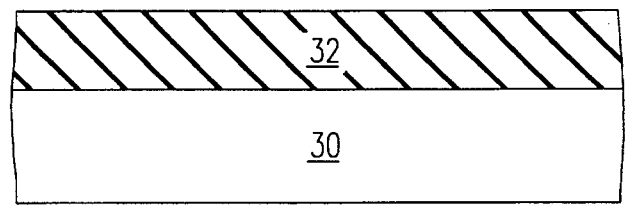
Figure 3:
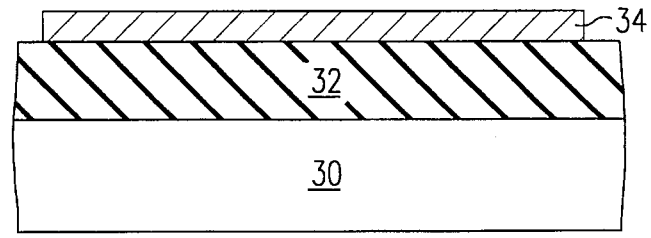

With reference to FIGS. 1–7, there is shown a method of forming an embodiment of this invention, a capacitor comprising lower and upper thin unreactive films contacting a high-dielectric-constant material layer. FIG. 1 illustrates a silicon semiconductor substrate 30. FIG. 2 illustrates an $SiO_2$ insulating layer 32 formed on the surface of the silicon substrate 30. FIG. 3 illustrates a palladium electrode base 34 deposited on the $SiO_2$ layer 32. Palladium layer 34 is conductive and will serve as the bulk of the lower electrode for the high-dielectric-constant capacitor.

Figure 4:
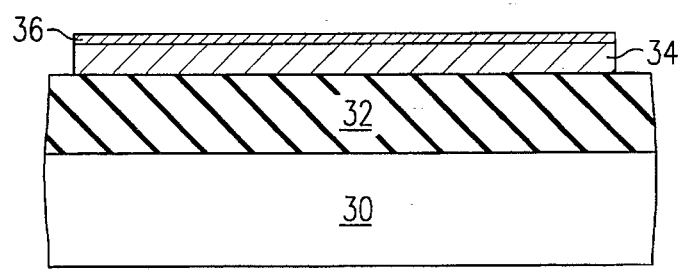

FIG. 4 illustrates a thin unreactive film of platinum 36 deposited on the palladium layer 34. The deposition of platinum layer 36 can be performed using sputtering, e-beam evaporation, chemical vapor deposition (CVD) or metal organic CVD (MOCVD). The microstructure and thermal stress of the Pt layer 36 is generally improved by depositing at elevated temperatures (300° C. to 600° C.). The deposition process may also be enhanced by ions, electrons, photons or plasma.

The substantial reduction in thickness of the Pt layer 36 as compared to one of standard thin-film thickness will make it much easier and quicker to dry etch. The patterning of Pt has primarily been accomplished in the past by very physical dry etching methods, such as ion milling. Consequently, with the very thin Pt layer 36, there is substantially less likelihood that an energetic Pt dry etch will damage other structures on the substrate 30. Alternatively, it is possible to etch the Pt layer 36 using an energetic reactive ion etch (RIE) process intended for the electrode base, Pd layer 34. This method should not differ significantly from straight ion milling of Pt layer 36. Due to its minimal thickness, Pt layer 36 would be inefficiently dry etched by this RIE without taking substantially longer than just etching Pd layer 34 alone. This method would not be practical for Pt layers of standard thin-film thickness. As another alternative, the thin unreactive layer could possibly patterned using lift-off. Although Pt can be difficult to remove with this technique, the very thin film makes this technique much more practical.

This structure might also be annealed before the deposition of the HDC material at or near the deposition temperature of the HDC material in order to create a more stable electrode. Similarly, after subsequent process steps, the capacitor structure with both electrodes might be annealed to improve the capacitor properties.

Figure 5:
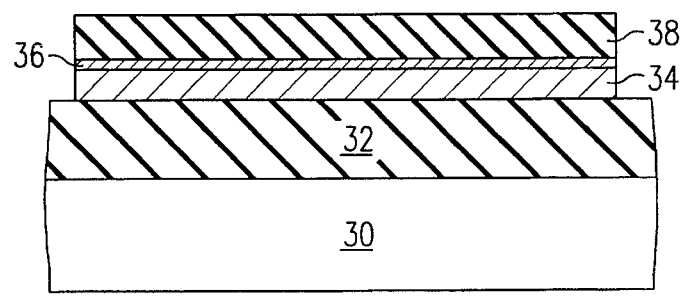
Figure 6:
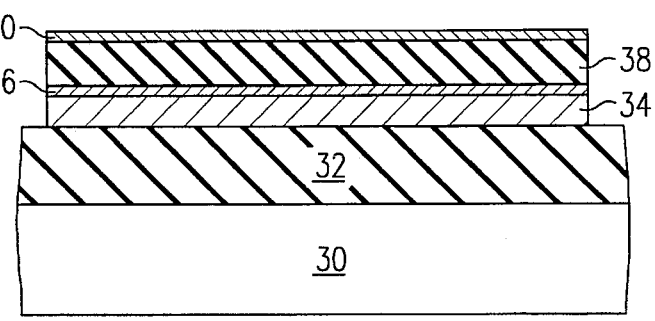
Figure 7:
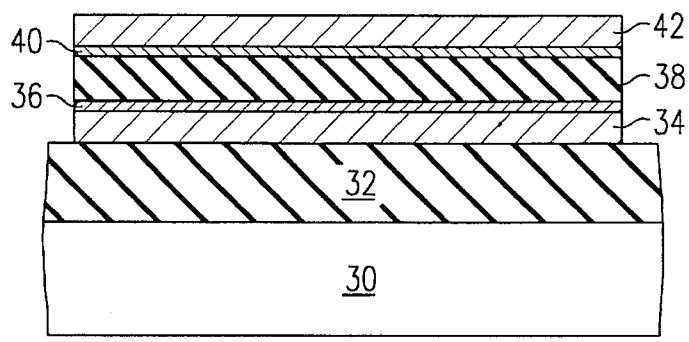

FIG. 5 illustrates the capacitor dielectric, a layer of high-dielectric-constant barium strontium titanate (BST) 38, deposited on Pt layer 36. The deposition of BST layer 38 generally requires very oxidizing conditions, however Pt layer 36 will be able to remain unoxidized, and provide a stable conductive interface to BST layer 38. FIG. 6 illustrates an upper thin unreactive film of Pt 40 deposited on BST layer 38. Using the very thin unreactive films of the present invention makes it much simpler to use symmetric layers to contact the HDC material. Here again there is less likelihood of damaging other structures such as HDC layer 38 with the Pt etch since Pt layer 40 will be substantially easier to etch than a standard thin-film layer of Pt. FIG. 7 illustrates an upper electrode of TiN 42 deposited on upper Pt film 40.

Figure 8:
FIG. 8 is a cross-sectional view of a thin unreactive film providing a conductive interface between a high-dielectric constant material and an electrode base.

In an alternate embodiment, FIG. 8 illustrates a palladium electrode base 34, a thin unreactive film of platinum 36 deposited on Pd layer 34, and a layer of high-dielectric-constant barium strontium titanate (BST) 38, deposited on Pt layer 36. Pt layer 36 provides a stable conductive interface between BST layer 38 and Pd layer 34.

Figure 9:
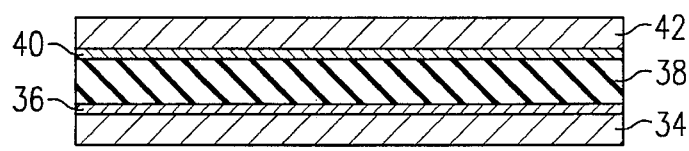
FIG. 9 is a cross-sectional view of a capacitor with lower and upper thin unreactive films contacting a high-dielectric-constant material.

In another alternate embodiment, FIG. 9 illustrates the structure of FIG. 8, with an upper thin unreactive film of Pt 40 deposited on BST layer 38, and an upper electrode of TiN 42 deposited on upper Pt film 40. Pt layer 40 provides a stable conductive interface between BST layer 38 and TiN layer 42.

Figure 10:
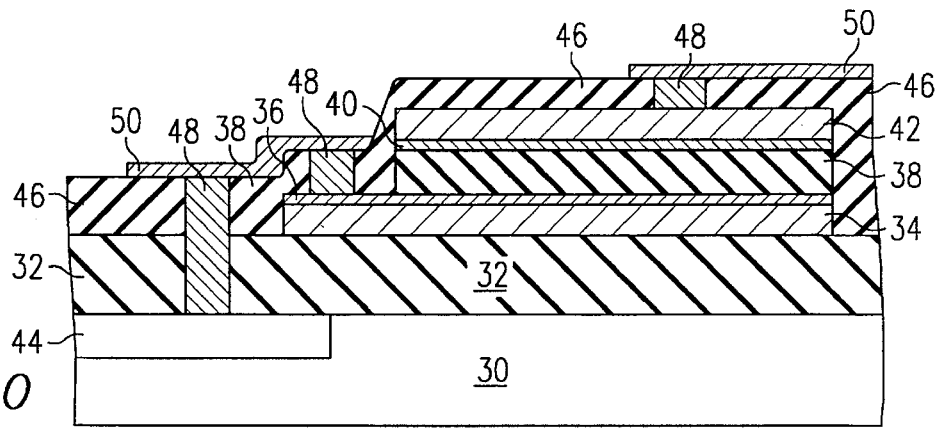
FIGS. 10–12 are cross-sectional views of capacitors with lower and upper thin unreactive films contacting a high-dielectric-constant material, formed on the surface of a semiconductor substrate.
Figure 11:
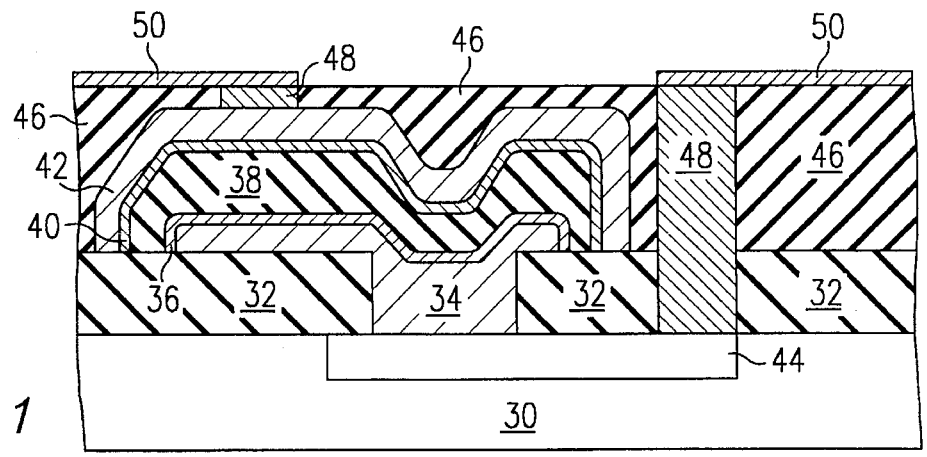
Figure 12:
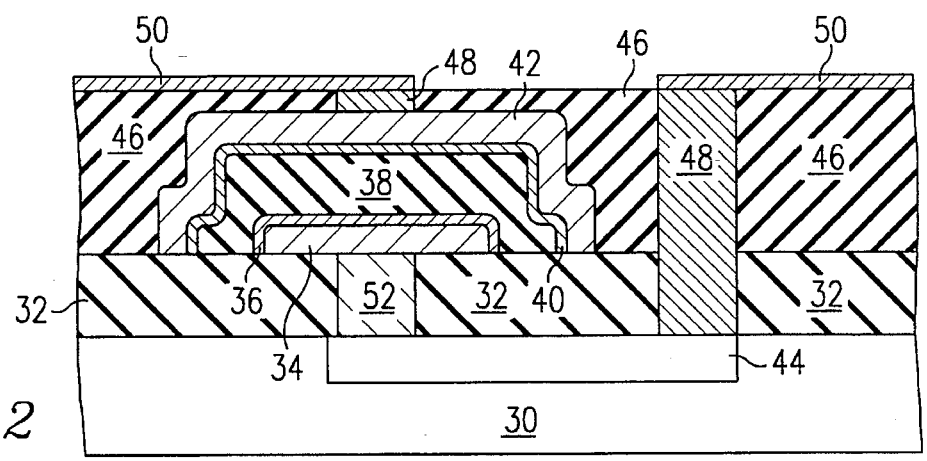

With reference to FIGS. 10–12, there are shown three alternate embodiments for different capacitor structures. The structures of FIGS. 11 and 12 can be used for capacitors which are substantially planar as shown, or for capacitors with high aspect ratios, wherein the sides of the electrodes contribute substantially to the total surface area of the electrodes in contact with the HDC material.

With reference to FIG. 10, there is illustrated a high-dielectric-constant capacitor utilizing thin unreactive films as part of each electrode. Basically the capacitor structure of FIG. 9 is used, however in this embodiment the Pd layer 34 is not used for direct electrical connection since electrical contact is made directly to the Pt layer 34 from above, via a conductive TiN plug 48. The TiN plug 48 makes electrical contact to the aluminum top metallization 50 through the second $SiO_2$ insulating layer 46. The two other TiN plugs 48 make electrical contact from the aluminum top metallization layer 50 to the TiN upper electrode 42 and to the doped silicon region 44.

With reference to FIG. 11, there is illustrated a high-dielectric-constant capacitor utilizing thin unreactive films as part of each electrode. The basic capacitor structure of FIG. 9 is used however in this embodiment the lower Pt layer 36, BST layer 38, upper Pt layer 40 and TiN layer 42 are deposited such that they form sidewalls and thus increase the total surface area of the electrodes in contact with the BST 38. In addition, the Pd layer 34 provides electrical connection to the doped silicon region 44 below it.

With reference to FIG. 12, there is again illustrated a high-dielectric-constant capacitor utilizing thin unreactive films as part of each electrode. The basic capacitor structure of FIG. 11 is used, however in thin embodiment the Pd layer 34 connects to the doped silicon region 44 via a TiN plug 52. Alternatively, the lower electrode base of Pd 34 in FIG. 12 could extend down into $SiO_2$ layer 32 to form the plug itself or a portion thereof. The plug may also be a composite of, for example, TiN and poly-silicon or palladium and tungsten, or various silicides such as nickel silicide, cobalt silicide, or titanium or tungsten silicide. Tungsten could be useful if drawing element 34 is chosen to be $RuO_2$.

Figure 13:
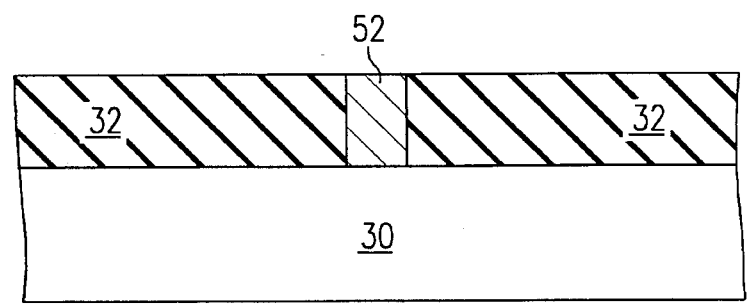
FIGS. 13–19 are cross-sectional views of a microelectronic structure showing the progressive steps in the fabrication of a capacitor with lower and upper thin unreactive films contacting a high-dielectric constant material.
Figure 14:
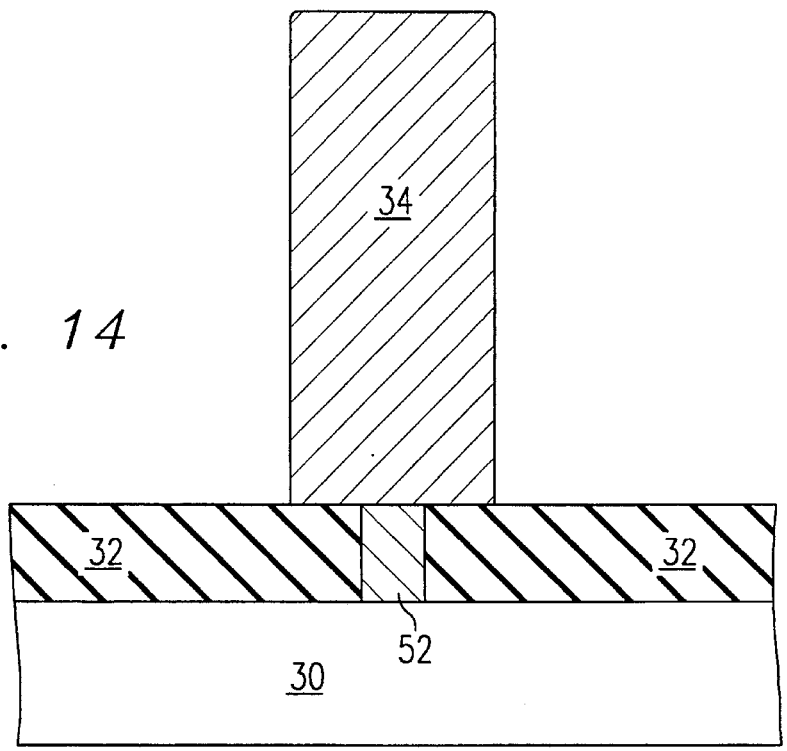

With reference to FIGS. 13–19, there is shown a method of forming another embodiment of this invention, a capacitor comprising lower and upper thin unreactive films contacting a high-dielectric-constant material layer. FIGS. 13–19 more clearly illustrate the advantages of using a high aspect ratio capacitor. FIG. 13 illustrates a silicon semiconductor substrate 30, with an $SiO_2$ insulating layer 32 formed thereon. A TiN plug 52 has been formed in $SiO_2$ layer 32. FIG. 14 illustrates a palladium electrode base 34 deposited on the $SiO_2$ layer 32 directly over the TiN plug 52. Again, palladium layer 34 will serve as the bulk of the lower electrode for the high-dielectric-constant capacitor. Palladium layer 34 is generally less than 500 nm wide and greater than 250 nm thick, preferably less than 400 nm wide and greater than 400 nm thick, and most preferably less than 300 nm wide and greater than 500 nm thick.

Figure 15:
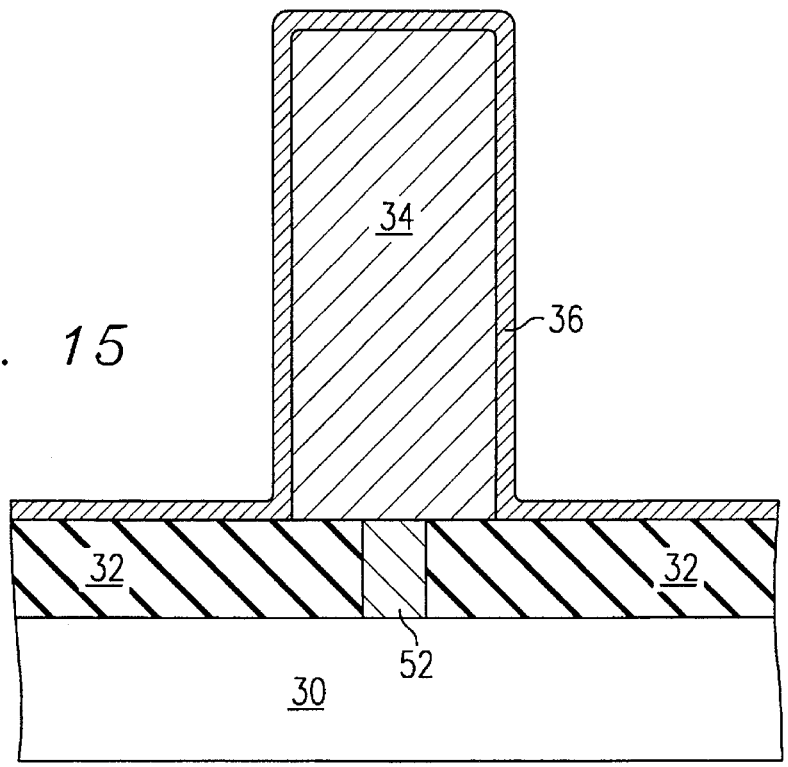
Figure 16:
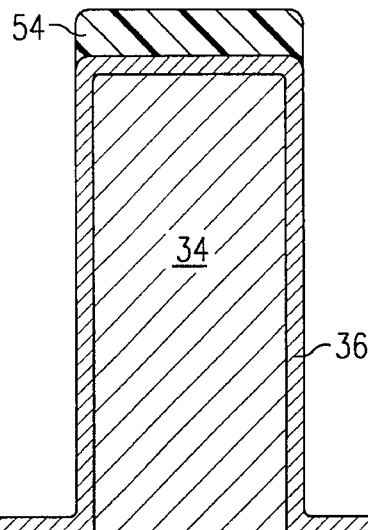
Figure 16:
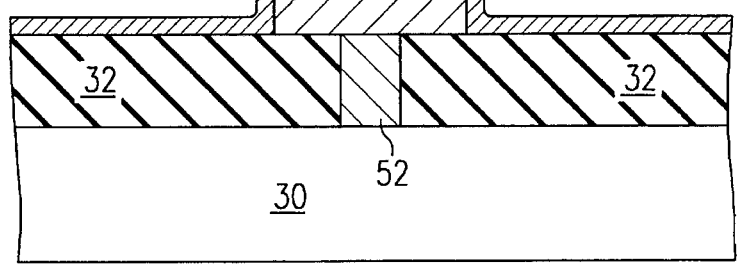
Figure 17:
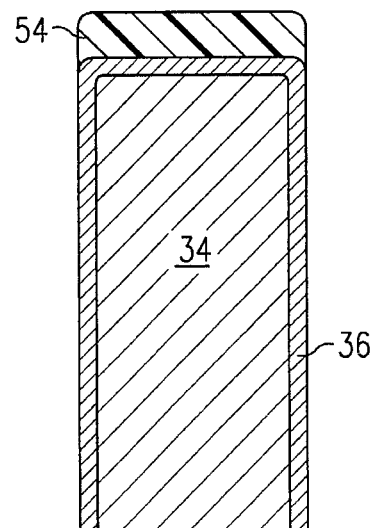
Figure 17:
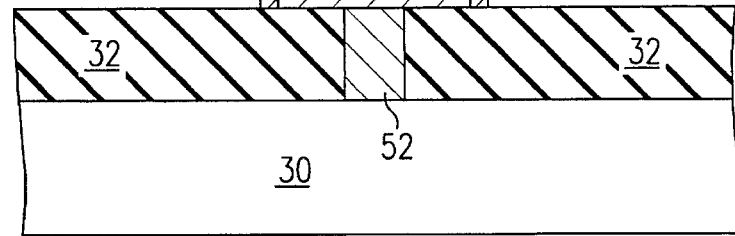

FIG. 15 illustrates a thin unreactive film of platinum 36 deposited uniformly on the palladium layer 34 and on the $SiO_2$ layer 32. A conformal deposition technique such as angular sputtering or more preferably MOCVD of the platinum is used in this case in order to obtain uniform coverage of the sides of Pd layer 34. FIG. 16 illustrates a layer of photoresist 54 that has been deposited and patterned to substantially mask the Pt layer 36 which is overlaying Pd layer 34. The same mask that was used to pattern the Pd layer 34 could possibly be used to pattern the photoresist 54. FIG. 17 illustrates the microelectronic structure after the exposed horizontal portions of the Pt layer 36 have been removed by anisotropic ion milling or RIE.

Figure 18:
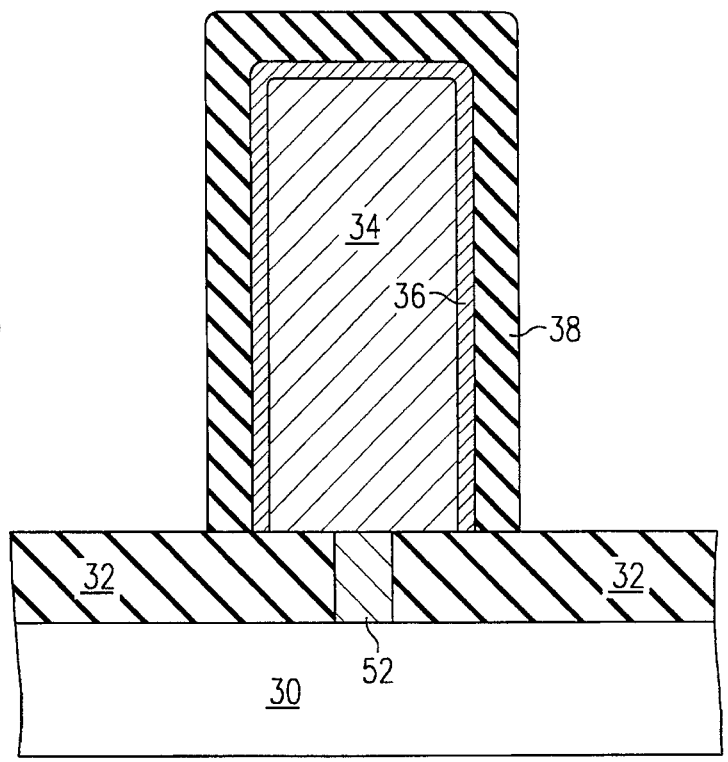
Figure 19:
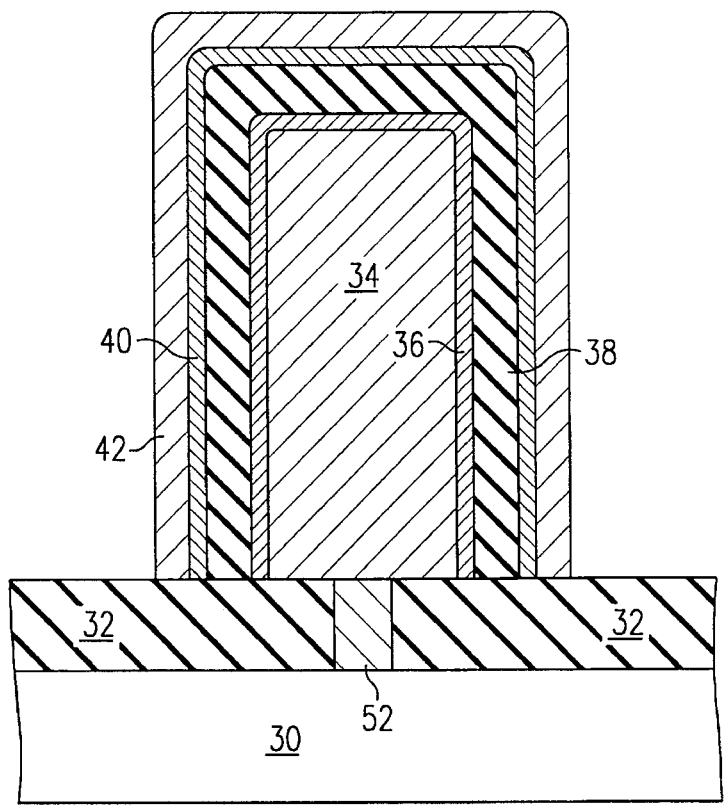

FIG. 18 illustrates the capacitor dielectric, a layer of BST 38, deposited on Pt layer 36. The same principles that were discussed for patterning Pt hereinabove can also be applied to the patterning of the BST 38. Alternatively, the BST does not need to be patterned except over regions near where vertical contact to the structure needs to be made. FIG. 19 illustrates an upper thin unreactive film of Pt 40 deposited on BST layer 38, and an upper electrode of TiN 42 deposited on upper Pt film 40. Like the lower Pt layer 36, the upper Pt film 40 also has a large surface area in contact with the BST layer 38.

Figure 20:
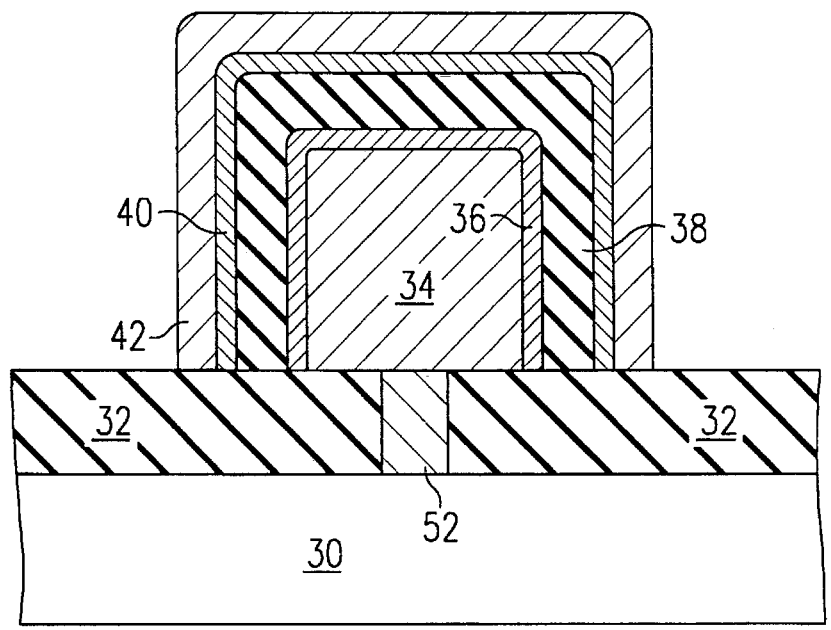
FIG. 20 is a cross-sectional view of a capacitor with lower and upper thin unreactive films contacting a high-dielectric-constant material.

With reference to FIG. 20, the capacitor structure of FIG. 19 is shown with a different aspect ratio to better illustrate the large variety of aspect ratios and structures which are encompassed by the present invention.

Figure 21:
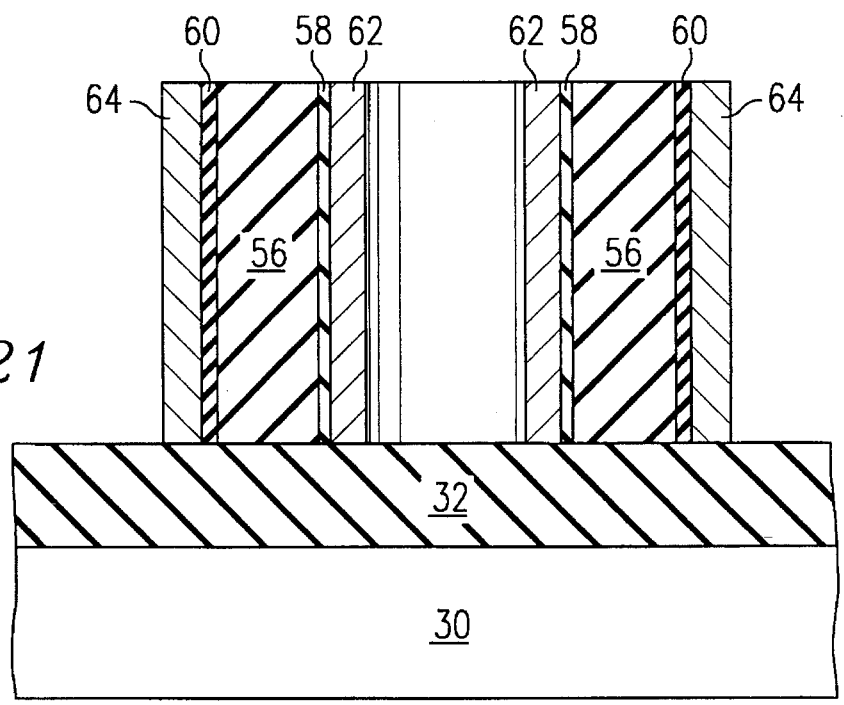
FIG. 21 is a cross-sectional view of the capacitor of FIG. 22 taken along 21—21.

In another alternate embodiment, FIG. 21 illustrates a cross-section and FIG. 22 illustrates a top plan view of a high-dielectric-constant capacitor utilizing thin unreactive films as part of each electrode. In this embodiment, BST is deposited on $SiO_2$ layer 32 and then dry etched into the shape of a hollowed out pillar. BST pillar 56 is formed before the electrode materials are deposited, thus circumventing exposure of the electrodes to the highly oxidizing BST deposition process. BST pillar 56 can take a variety of forms such as a tube or a donut, it can be circular, oval, square, rectangular or of a more complicated or irregular shape, it can have sharp corners or rounded corners, rough surfaces or smooth surfaces, etc.

Using conformal and nonconformal methods described hereinabove, an inner thin unreactive film of Pt 58 and an outer thin unreactive film of Pt 60 are formed on the inner and outer vertical surfaces of BST pillar 56 simultaneously. The same methods can again be used to form an inner conductive layer of TiN 62 and an outer conductive layer of TiN 64 on the vertical surfaces of Pt films 58 and 60, respectively.

With reference to FIG. 23, a capacitor similar to those of FIGS. 19 and 20 is illustrated. However, in accordance with this embodiment, two thin unreactive films are deposited between the lower electrode base Pd 34 and the BST layer 38. A thin unreactive film of $RuO_2$ 66 (can also be Ru which is partially or fully oxidized during BST deposition) is formed on Pd layer 34. A thin unreactive film of Pt 68 is formed on $RuO_2$ layer 66. BST layer 38 is then formed on Pt layer 68. This structure would provide the low leakage current of Pt in contact with the BST 38, along with the oxygen barrier capabilities of $Ru/RuO_2$, while using a minimum amount of each material in order to control cost.

Figure 24:
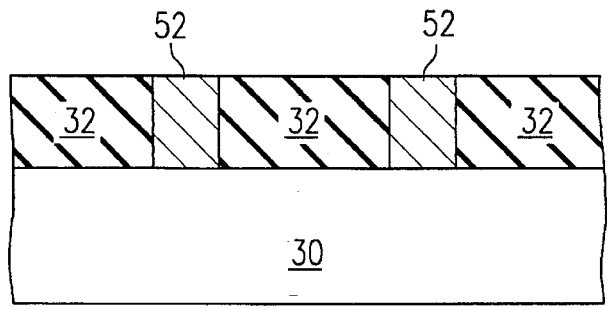
FIGS. 24–32 are cross-sectional views of a microelectronic structure showing the progressive steps in the fabrication of a capacitor with inner and outer thin unreactive films contacting a high-dielectric constant material.
Figure 25:
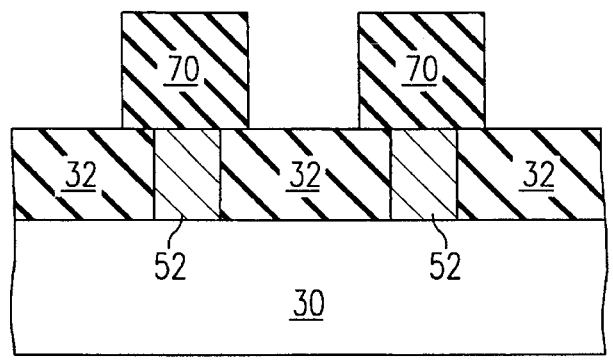
Figure 26:
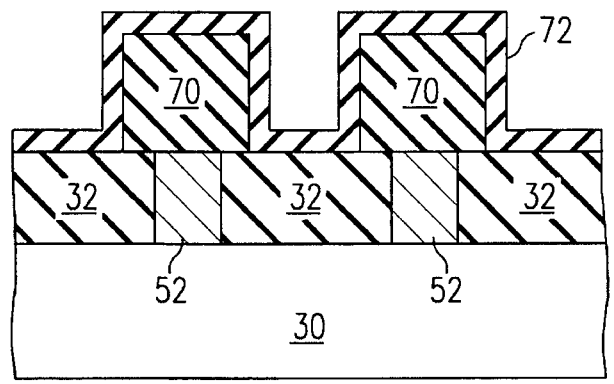
Figure 27:
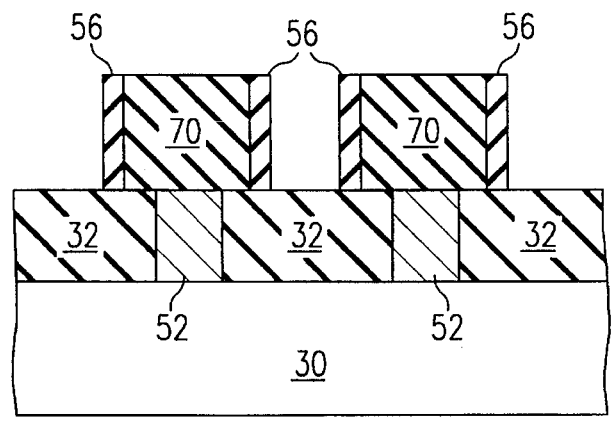
Figure 28:
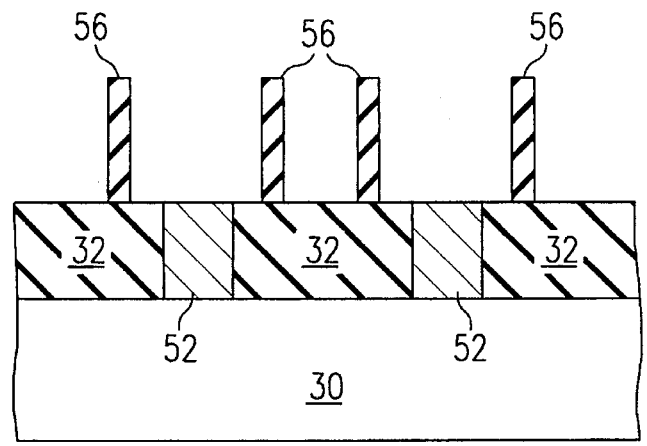

In yet another alternate embodiment, FIGS. 24–32 illustrate a cross-section of a high-dielectric-constant capacitor utilizing thin unreactive films as part of each electrode. In this embodiment, a capacitor similar to that of FIGS. 21 and 22 is produced, however more process detail is shown as is more detail on the electrical connection to the capacitor. TiN capacitor plugs 52 are again formed in $SiO_2$ insulator 32 as shown in FIG. 24, then $SiO_2$ pillars 70 are formed over TiN plugs 52 as shown in FIG. 25. FIG. 26 illustrates a conformal BST layer 72 deposited on the structure, and subsequently anisotropically etched to form BST pillars 56 as illustrated in FIG. 27, similar to the structure shown in FIGS. 21 and 22. As with the method of FIG. 21 and 22, BST pillar 56 is formed before the electrode materials are deposited, thus circumventing exposure of the electrodes to the highly oxidizing BST deposition process. The function of oxygen barrier is effectively transferred from the electrode materials to pillar mask 70, thus eliminating a significant constraint on electrode material selection. The material chosen for pillar mask 70 should be a good barrier to oxygen diffusion in order to protect plug 52 or other underlying oxidizable layers during BST deposition, and is also preferably relatively inert, especially to oxygen. Pillar mask 70 should also be relatively easy to remove after deposition and etching of BST layer 72, as shown in FIG. 28. A wet or dry etch may be used to remove pillar mask 70, exposing plug 52, and leaving BST pillar 58.

Figure 29:
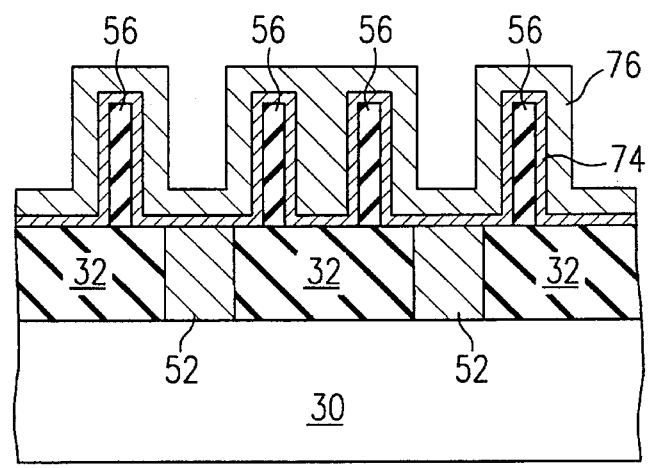
Figure 30:
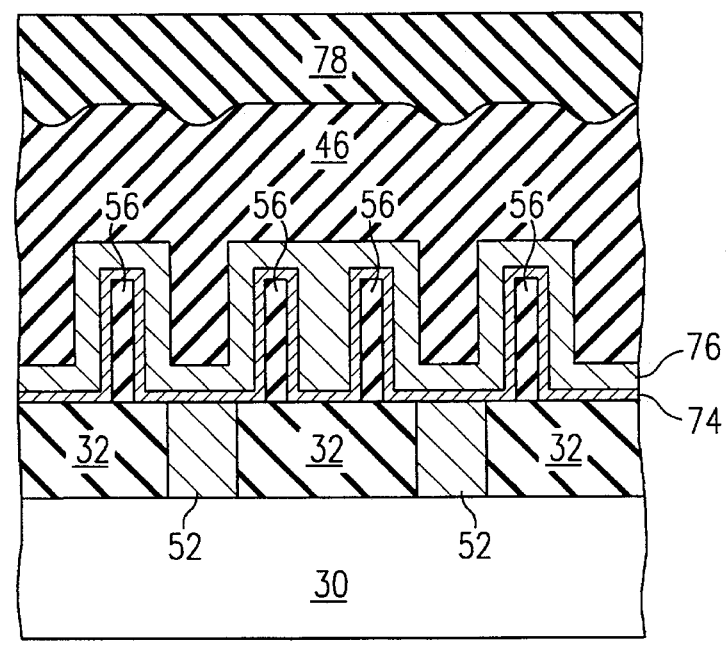
Figure 31:
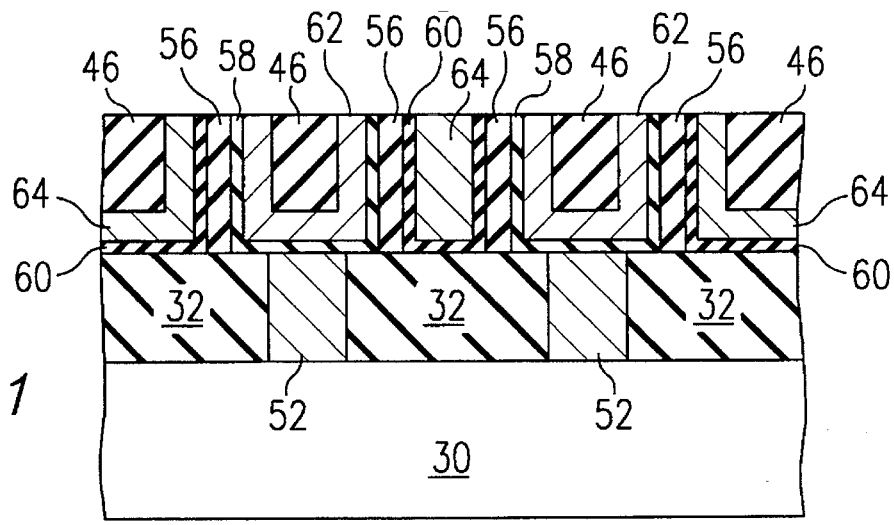
Figure 32:
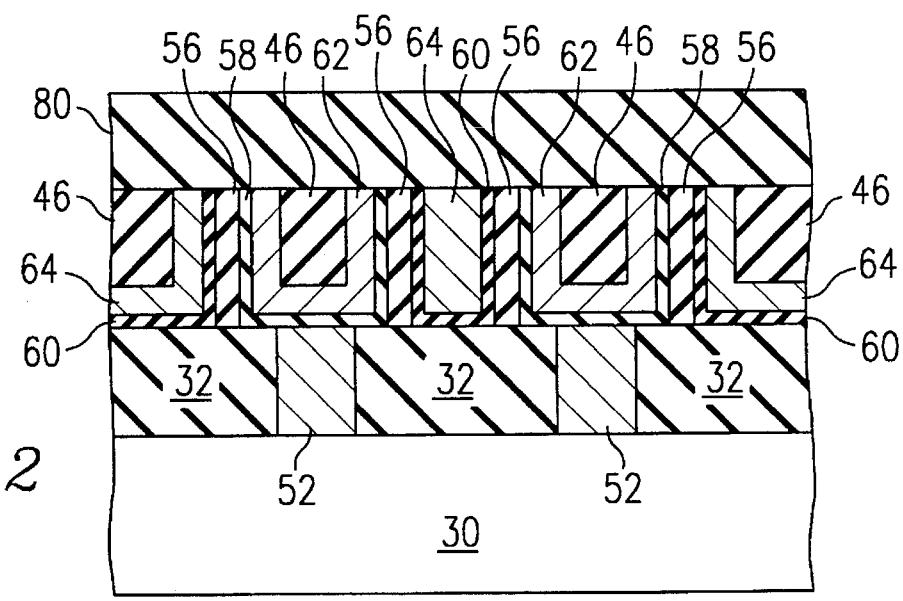

Using conformal (or semi-conformal) deposition methods described hereinabove, conformal Pt layer 74 and conformal TiN layer 76 are formed on the structure as illustrated in FIG. 29. Although not shown, undesired regions of Pt layer 74, TiN layer 76 and/or BST layer 72 may be removed from the substrate. A 2nd level $SiO_2$ insulator layer 46 is deposited over the structure and then a planarizing $SiO_2$ layer 78 is formed on $SiO_2$ insulator layer 46, providing the structure shown in FIG. 30. The structure is then etched back using chemical mechanical polishing or dry etching until the portion of TiN layer 76 and Pt layer 74 on top of BST pillar 56 is removed (possibly along with a top part of BST pillar 56), as shown in FIG. 31. As with the method of FIGS. 21 and 22, this isolates the inner and outer electrodes, forming an inner thin unreactive film of Pt 58 and an inner conductive layer of TiN 62 on the inner vertical surface of BST pillar 56 and on the TiN plug 52. Also formed are an outer thin unreactive film of Pt 60 and an outer conductive layer of TiN 64 on the outer vertical surface of BST pillar 56. As can be seen in FIG. 31, the outer electrode can be made common between e.g., all capacitors in a DRAM. Finally, FIG. 32 illustrates 3rd level $SiO_2$ layer 80 formed over the structure of FIG. 31. Alternatively, 2nd level $SiO_2$ layer 46 could be removed if different or additional processing steps are desired.

With the structure/method of FIGS. 21–22 and 24–32, since the electrodes are formed after high-dielectric-constant material deposition (and other processing), it may be possible to use a single layer for the electrodes using a material selected from either the thin unreactive layer materials, the electrode base (or inner/outer conductive electrode) materials, or the upper electrode materials, thus further simplifying the structure and saving processing steps and/or cost.

The sole Table, below, provides an overview of some embodiments and the drawings.

TABLE

| Drawing Element | Preferred or Specific Examples | Generic Term | Other Alternate Examples |
|---|---|---|---|
| 30 | Silicon | Substrate | Other single component semiconductors (e.g. germanium, diamond) Compound semiconductors (e.g. GaAs, InP, Si/Ge, SiC) Ceramic substrates |
| 32 | Silicon dioxide | First level insulator | Other insulators (e.g. silicon nitride) May be more than one layer (e.g. $Si_3N_4$ barrier over $SiO_2$) Combinations of the above materials |
| 34 | Palladium | Lower electrode base | Other high melting point noble or platinum group metals (e.g iridium, rhenium, rhodium) Conductive metal oxides (e.g. ruthenium dioxide, tin oxide, osmium oxide, rhodium oxide, iridium oxide, indium oxide, titanium oxide, TiON, zinc oxide, doped zinc oxide) Conductive metal nitrides (e.g. titanium nitride, tantalum nitride) Combinations of the above materials If used, ruthenium dioxide base may contain some unoxidized or partially oxidized ruthenium The material of this layer should be different from that used for drawing element 36 below |
| 36 | Platinum | Lower thin unreactive film | Ruthenium dioxide Iridium oxide |
| 40 | | Upper thin unreactive film | Alloys of Pt with other noble or platinum group metals such as Re, Ir, Pd, Rh, Ru, Au or Ag Combinations of the above materials or more complex conductive oxides Layers of the above materials If used, ruthenium dioxide film may contain some unoxidized or partially oxidized ruthenium |
| 38 | Barium strontium titanate | High-dielectric-constant material layer | Other perovskite, ferroelectric, or high-dielectric-constant oxides (e.g. $(Ba,Sr,Ca,Pb)(Ti,Zr)O_3$, $(Pb,La)(Zr,Ti)O_3$, bismuth titanate, potassium tantalate, lead niobate, potassium niobate, lead zinc niobate, lead magnesium niobate) Donor, acceptor, or donor and acceptor doped oxides listed above Combinations of the above materials Layers of the above materials |
| 42 | Titanium nitride | Upper electrode | Other conductive metal compounds (e.g. nitrides: ruthenium nitride, tin nitride, zirconium nitride; oxides: ruthenium dioxide, tin oxide, titanium oxide, TiON, zinc oxide, doped zinc oxide, iridium oxide; silicides: titanium silicide, tantalum silicide, tungsten silicide, molybdenum silicide, nickel silicide; carbides: tantalum carbide; borides: titanium boride) Noble or platinum group metals (e.g. platinum, palladium, rhodium, gold, iridium, silver) Reactive metals (e.g. tantalum, titanium, molybdenum) Other common semicon- |

TABLE-continued

| Drawing Element | Preferred or Specific Examples | Generic Term | Other Alternate Examples |
|---|---|---|---|
| | | | ductor electrodes (e.g. aluminum, copper, tungsten, poly-Si, doped Si or Ge) Combinations of the above materials May contain more than one layer The material of this layer is typically different from that used for drawing element 40 above |
| 44 | Doped silicon | Conductive semiconductor material | Semiconductor devices |
| 46 | Silicon dioxide | Second level insulator | Other insulators (e.g. silicon nitride, SOG, polymer) Layers of the above materials |
| 48 | TiN | Conductive plug | Other reactive metal compounds (e.g. nitrides: zirconium nitride; silicides: titanium silicide, tantalum silicide, tungsten silicide, molybdenum silicide, nickel silicide, cobalt silicide; carbides: tantalum carbide; borides: titanium boride) Single component semiconductors (e.g. single- or poly-crystalline silicon, germanium) Reactive metals (e.g. tungsten, tantalum, titanium, molybdenum, titanium tungsten) Conductive carbides and borides (e.g. boron carbide) Aluminum, copper, and alloys with these elements Compound semiconductors (e.g. GaAs, InP, Si/Ge, SiC) Combinations of the above materials |
| 50 | Aluminum | Top metallization | Other common semiconductor electrodes (e.g. silicides, TiN) Two or more layers of metal and dielectric Combinations of the above materials |
| 52 | TiN | Capacitor plug | Other reactive metal compounds (e.g. nitrides: zirconium nitride; silicides: titanium silicide, tantalum silicide, tungsten silicide, molybdenum silicide, nickel silicide; carbides: tantalum carbide; borides: titanium boride) Single component semiconductors (e.g. single- or poly-crystalline silicon, germanium) Reactive metals (e.g. tungsten, tantalum, titanium, molybdenum) Conductive carbides and borides (e.g. boron carbide) Compound semiconductors (e.g. GaAs, InP, Si/Ge, SiC) May be multiple layers (e.g. TiN/TiSi$_x$/poly-Si) Combinations of the above materials |
| 54 | Photoresist | Mask layer | Other semiconductor masking materials |
| 56 | Barium strontium titanate | High-dielectric-constant material pillar | Other perovskite, ferroelectric, or high-dielectric-constant oxides (e.g. (Ba,Sr,Pb)(Ti,Zr)O$_3$, (Pb,La)(Zr,Ti)O$_3$, bismuth titanate, potassium tantalate, lead scandium tantalate, lead niobate, potassium niobate, lead zinc niobate, lead magnesium niobate) Donor, acceptor, or donor and acceptor doped oxides listed above Combinations of the above materials Layers of the above materials |
| 58 | Platinum | Inner thin unreactive film | Ruthenium dioxide Iridium oxide |
| 60 | | Outer thin unreactive film | Alloys of Pt with other noble or platinum group metals such as Re, Ir, Pd, Rh, Ru, Au or Ag Combinations of the above materials or more complex conductive oxides Layers of the above materials If used, ruthenium dioxide film may contain some unoxidized or partially oxidized ruthenium |
| 62 | Titanium nitride | Inner conductive electrode | Other conductive nitrides (e.g. zirconium nitride, hafnium nitride, tantalum nitride) |
| 64 | | Outer conductive electrode | High melting point noble or platinum group metals (e.g palladium, iridium, rhenium, rhodium) Conductive oxides (e.g. ruthenium dioxide, tin oxide, titanium oxide, TiON, zinc oxide, doped zinc oxide, iridium oxide) Other common semiconductor electrodes (e.g. aluminum, copper, tungsten, poly-Si, silicides, doped Si or Ge) Combinations of the above materials If used, ruthenium dioxide electrode may contain some unoxidized or partially oxidized ruthenium The material of these |

TABLE-continued

| Drawing Element | Preferred or Specific Examples | Generic Term | Other Alternate Examples |
|---|---|---|---|
| | | | electrodes should be different from that used for drawing elements 56 and 58 above |
| 66 | Ruthenium dioxide | 1st lower thin unreactive film | Other materials from drawing element 36 above, but different from material selected for drawing element 68 below |
| 68 | Platinum | 2nd lower thin unreactive film | Other materials from drawing element 36 above, but different from material selected for drawing element 66 above |
| 70 | $SiO_2$ | Pillar mask | Other removable, oxygen barrier or chemically inert materials (e.g. $Si_3N_4$, BPSG, MgO, CaO, $CaF_2$, $Al_2O_3$, $B_2O_3$, boron oxide) |
| 72 | Barium strontium titanate | Conformal HDC material layer | Other materials from drawing element 56 above |
| 74 | Pt | Conformal thin unreactive layer | Other materials from drawing elements 36, 58 or 60 above |
| 76 | TiN | Conformal conductive layer | Other materials from drawing elements 34, 62 or 64 above |
| 78 | $SiO_2$ | Planarizing insulator | Other materials from drawing elements 32 or 46 above |
| 80 | $SiO_2$ | 3rd level insulator | Other materials from drawing elements 32 or 46 above |

There are many combinations of materials which could be used for the thin unreactive layer and for the other portion of the electrode, each combination having distinctive advantages (and possibly disadvantages). For example, a thin unreactive film of Pt forms substantially fewer hillocks than a standard thin-film layer of Pt. A thin unreactive film of Pt creates substantially less alpha-particles than a standard thin-film layer since there is a much smaller quantity of Pt involved. Thus a thin unreactive film of Pt formed over an electrode base of a conductive oxide (e.g. $RuO_2$) would control the Schottky barrier and minimize the leakage current, while the conductive oxide would provide an oxygen diffusion barrier.

As another example a thin unreactive film of Pt could be formed over an electrode base of another noble or platinum group metal such as Pd. Pd is much less expensive than Pt, and, although not as inert as Pt, Pd is also not easily oxidized and has a high melting point so it could withstand the high-dielectric-constant material deposition process. As used herein, the term "high melting point", when used in reference to an electrode material, means a material with a melting point temperature sufficiently above the HDC deposition process temperature so as not to be significantly adversely affected (e.g. rendered nonconductive) by the deposition process. As used herein, the term "noble or platinum group metal" means an element which either is completely unreactive or reacts only to a limited extent with other elements (i.e. gold, silver, platinum, palladium, iridium, rhenium, mercury, ruthenium, osmium and rhodium).

As another example, a thin unreactive film of Pt could be formed over a electrode base of a conductive nitride such as TiN. As stated hereinabove, TiN has been fairly extensively used and proven in semiconductor processing, thus lending it fairly easy acceptance. In addition, TiN must undergo substantial oxidation before it forms an insulating titanium oxide. For example, TiON and TiO are conductive, although $TiO_2$ is insulating.

The thin unreactive film could also be a conductive oxide such as $RuO_2$. As an example, a thin unreactive layer of $RuO_2$ could be formed over an electrode base of a noble or platinum group metal such as Pd. In addition to the advantages described for Pd hereinabove, the $RuO_2$ would provide an oxygen barrier during HDC deposition.

As another example, a thin unreactive film of $RuO_2$ could be formed over an electrode base of a conductive nitride such as TiN. One of the advantages of this combination is that the TiN has been accepted and proven in semiconductor processing. Again the $RuO_2$ would provide an oxygen barrier during HDC deposition.

The lower electrode base may comprise still other materials than those listed in the table yet which may be preferred for various applications. For example, the lower electrode base may comprise ternary (or greater) amorphous conductive nitrides (e.g. Ta—Si—N, Ti—Si—N, Ta—B—N, Ti—B—N); exotic (non-standard Si processing)conductive nitrides (e.g. Zr nitride, Hf nitride, Y nitride, Sc nitride, La nitride and other rare earth nitrides, N deficient Al nitride, doped Al nitride, Mg nitride, Ca nitride, Sr nitride, Ba nitride); alloys of the above exotic conductive nitrides with common Si processing materials such as TiN, GaN, Ni nitride, Co nitride, Ta nitride, W nitride (e.g. Ta—Al—N, Ti—Al—N); or noble-metal-insulator-alloys (e.g. Pd—Si—N, Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, Ag—Si—N).

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. However, as described hereinabove, each example may have beneficial properties which make it preferable over the other examples depending on the importance of those properties to the application. In fact, for some applications, some of the other alternate examples my be preferred over the specific examples based on the properties of the materials. The thin unreactive film may sometimes be referred to as being part of the electrode and rosy sometimes be referred to as being an interface to the electrode; the structures and methods of the present invention are substantially the same in either case. Layers that are described as alloys, compounds, mixtures, etc., are meant to be intentionally formed, substantial layers, as opposed to an unintentional partial mixture of the components of two separate layers that my be incidentally formed at the interface of those layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising:
   (a) forming a non-Ru, non-$RuO_2$ conductive lower electrode base, comprising sidewalls with an aspect ratio of at least 1:2;
   (b) forming a lower thin ruthenium dioxide film less than 35 nm thick on said lower electrode base, including on said sidewalls; and
   (c) forming a high-dielectric-constant material layer on said lower thin ruthenium dioxide film, whereby the lower thin ruthenium dioxide film provides a stable conductive interface between the high-dielectric-constant material layer and the lower electrode base.

2. The method according to claim 1, wherein said lower electrode base is less than 500 nm wide and greater than 250 nm thick.

3. The method according to claim 1, wherein said lower electrode base comprises a high melting point noble or platinum group metal.

4. The method according to claim 1, wherein said lower electrode base comprises a conductive nitride.

5. The method according to claim 1, wherein said lower electrode base comprises a conductive oxide.

6. The method according to claim 1, wherein said high-dielectric-constant material layer is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

7. The method according to claim 1, said method further comprising forming an upper thin unreactive film on said high-dielectric-constant material layer.

8. A microelectronic structure comprising:
   (a) a non-Ru, non-$RuO_2$ conductive lower electrode base, comprising sidewalls with an aspect ratio of at least 1:2;
   (b) a lower thin ruthenium dioxide film less than 35 nm thick overlying said lower electrode base, including said sidewalls; and
   (c) a high-dielectric-constant material layer overlying said lower thin ruthenium dioxide film, whereby the lower thin ruthenium dioxide film provides a stable conductive interface between the high-dielectric-constant material layer and the lower electrode base.

9. The structure of claim 8, wherein said lower electrode base is less than 500 nm wide and greater than 250 nm thick.

10. The structure of claim 9, wherein said lower electrode base is less than 400 nm wide and greater than 400 nm thick.

11. The structure of claim 10, wherein said lower electrode base is less than 300 nm wide and greater than 500 nm thick.

12. The structure of claim 8, wherein said lower electrode base comprises a high melting point noble or platinum group metal.

13. The structure of claim 12, wherein said lower electrode base comprises palladium.

14. The structure of claim 8, wherein said lower electrode base comprises a conductive nitride.

15. The structure of claim 14, wherein said conductive nitride is selected from the group consisting of: titanium nitride, tantalum nitride, zirconium nitride, hafnium nitride, and combinations thereof.

16. The structure of claim 8, wherein said lower electrode base comprises a conductive oxide.

17. The structure of claim 16, wherein said conductive oxide is selected from the group consisting of: tin oxide, osmium oxide, rhodium oxide, iridium oxide, indium oxide, and combinations thereof.

18. The structure of claim 8, wherein said high-dielectric-constant material layer is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

19. The structure of claim 8, further comprising an upper thin unreactive film overlying said high-dielectric-constant material layer.

20. The structure of claim 19, wherein said upper unreactive film is ruthenium dioxide.

21. The structure of claim 19, further comprising an upper electrode overlying said upper unreactive film.

22. A microelectronic structure comprising:
   (a) a non-Ru, non-$RuO_2$ conductive lower electrode base, comprising sidewalls with an aspect ratio of at least 1:2;
   (b) a first ruthenium dioxide film overlying said electrode base, including said sidewalls, wherein said first ruthenium dioxide film is less than 35 nm thick;
   (c) a high-dielectric-constant material layer overlying said first ruthenium dioxide film;
   (d) a second ruthenium dioxide film overlying said high-dielectric-constant material layer, wherein said second ruthenium dioxide film is less than 35 nm thick; and
   (e) an upper electrode overlying said second ruthenium dioxide film.

* * * * *